| United States Patent [19] | [11] Patent Number: 5,543,335 |
|---|---|
| Zommer | [45] Date of Patent: Aug. 6, 1996 |

[54] ADVANCED POWER DEVICE PROCESS FOR LOW DROP

[75] Inventor: Nathan Zommer, Los Altos, Calif.

[73] Assignee: IXYS Corporation, San Jose, Calif.

[21] Appl. No.: 57,293

[22] Filed: May 5, 1993

[51] Int. Cl.$^6$ .................. H01L 21/306; H01L 21/22; H01L 21/38

[52] U.S. Cl. .................. 437/10; 437/141

[58] Field of Search ................. 437/6, 974, 10, 437/11, 12, 13, 141; 148/DIG. 60, DIG. 61

[56] References Cited

U.S. PATENT DOCUMENTS

| | | |
|---|---|---|
| 3,832,247 | 8/1974 | Saddler et al. |
| 4,341,594 | 9/1982 | Carlson et al. ............... 156/643 |
| 4,356,056 | 10/1982 | Cornette ........................ 156/649 |
| 4,588,472 | 5/1986 | Shimizu ......................... 437/60 |
| 4,589,928 | 5/1986 | Dalton et al. ............. 148/DIG. 60 |
| 4,610,730 | 9/1986 | Harrington et al. ............ 437/148 |
| 4,695,867 | 9/1987 | Flohrs et al. .................... 357/46 |
| 4,978,419 | 12/1990 | Nada et al. .................... 437/229 |
| 5,031,021 | 7/1991 | Baba et al. ..................... 357/53 |
| 5,264,378 | 11/1993 | Sakurai ......................... 437/974 |
| 5,397,718 | 3/1995 | Furuta et al ................... 437/40 |

*Primary Examiner*—Mary Wilczewski
*Assistant Examiner*—Brian K. Dutton
*Attorney, Agent, or Firm*—Townsend & Townsend & Crew LLP

[57] ABSTRACT

A method for fabricating a power semiconductor device with a low forward voltage drop using polymer passivation. A polymer passivation layer is deposited over the device. Impurities are introduced into the backside of the device by ion implantation, the backside of the device being on the opposite side of the semiconductor device from the polymer passivation layer. The impurities are then diffused into the semiconductor device.

40 Claims, No Drawings

ADVANCED POWER DEVICE PROCESS FOR LOW DROP

BACKGROUND OF THE INVENTION

This invention relates to a method for fabricating a power semiconductor device with a low forward voltage drop.

In the past, processing a power semiconductor device to reduce its forward voltage drop was incompatible with certain passivation materials. The temperatures required for conventional techniques were often too high for certain passivation materials, particularly those with good high voltage isolation characteristics, e.g., polymers. It was therefore difficult to fabricate a power semiconductor device which had both a low forward voltage drop and good high voltage isolation.

Moreover, traditional potting and encapsulation techniques have proven insufficient for providing protection from environmental contamination for semiconductor power devices. Plastic encapsulated devices develop contaminating byproducts due to the polymerization process. Additionally, the basic components of plastics often contain ionic contaminants like K+ and Na+. Potting compounds used in module assembly create similar problems. Generally, plastic encapsulated devices are not hermetically sealed, and are therefore prone to degradation in severe environmental conditions. Some methods were developed in which, for example, a semiconductor die was coated during the assembly process by a highly pure rubber which was not masked, but applied over the die in a module after die attach, after wire bonding, or just before applying the final encapsulation. However, such a technique requires additional "post-fab" processing.

Therefore, there is a need for a fabrication method which uses polymer passivation in conjunction with power device processing to create a low forward voltage drop. There is also a need to provide semiconductor devices with additional protection from environmental contaminants with a process which can be integrated into the fabrication process.

SUMMARY OF THE INVENTION

The invention provides a method for fabricating a power semiconductor device with a low forward voltage drop using polymer passivation. Embodiments of the invention are directed specifically toward the fabrication of silicon semiconductor power devices.

The method comprises the following steps. A polymer passivation layer is deposited over the device. Impurities are introduced into the backside of the device, the backside of the device being on the opposite side of the semiconductor device from the polymer passivation layer. The impurities are then diffused into the semiconductor device.

Specific embodiments include additional steps in the fabrication of a device according to the invention. For example, a silicon nitride layer is usually deposited on the device before the polymer passivation. Another dielectric layer, glass or oxide, may also be deposited over the silicon nitride before the polymer. The polymer passivation layer, preferably comprising polyimide, may be deposited with a very precise thickness by means of a spinning method, and cured by a temperature hard bake between 300° C. and 420° C. Apertures in these layers may then be defined using standard photolithographic techniques. The introduction and diffusion of impurities is preferably accomplished by means of an ion implantation and subsequent activation anneal between 400° C. and 420° C. These relatively low processing temperatures are compatible with polymer passivation.

Polymer passivation has also proven effective as protection against ionic contamination, acid, and moisture effects on power devices used in discrete power packages or in module multi-die packaged devices. Thus, the invention provides additional protection from environmental contamination without requiring "post-fab" processing.

A further understanding of the nature and advantages of the present invention may be realized by reference to the remaining portions of the specification and the drawings.

DESCRIPTION OF THE SPECIFIC EMBODIMENTS

In a specific embodiment, a highly pure polymer passivation is deposited on a wafer silicon semiconductor before dicing up. A wafer spinning method, similar to those used for deposition of photoresist coatings, is used for efficiency and precise thickness control. A polymer is employed which is maskable and can be developed and easily etched like photoresist. The polymer must be able to withstand high temperatures. In fact, photoresist itself is a suitable polymer passivation coating. According to the invention, any combination of glass and/or ceramic passivation with the polymer passivation is effective in achieving the desired passivation goal.

In one embodiment, it is preferable to perform both silicon nitride and polyimide passivation, as both have been proven effective in high voltage stable devices. The tolerance of these materials to high temperatures is critical during subsequent backside processing steps. These steps include "back-lapping" or "wafer-thinning", and backside doping to reduce back contact resistance for reduced forward voltage drop. The backside doping is accomplished by ion implantation, followed by an optional activation anneal between the temperatures of 400° C. and 420° C. This is then followed by the backside deposition of metal, and optional sintering at 400°–420° C.

The following are steps for fabricating patterned and metallized power devices according to one embodiment of the invention:

1. Deposit a dielectric material (preferably silicon nitride or Si-rich silicon nitride) over a semiconductor wafer.

2. Deposit silicon glass or silicon oxide layer (optional). Note: In an alternate embodiment, step 2 may precede step 1.

3. Deposit polymer passivation (preferably polyimide) 3 micron to 5 microns thick over the silicon nitride.

4. Cure the polymer passivation with a "temperature" hard bake at 300° C. to 420° C.

4. Develop and define pattern on polymer using photoresist based lithography.

5. Remove the photoresist (optional).

6. Etch apertures (or pad openings) in the nitride and/or oxide passivation. (It is optional to remove photoresist at this step.)

7. Thin the wafer using a back-lapping, wafer-thinning technique down to desired thickness.

8. Backside dope the device, preferably by ion implantation. Use N type species for N+type substrate and p type species for p+type wafer. Example: $5 \times 10^{15}$ cm$^{-2}$ dose of phosphorus or $5 \times 10^{15}$ cm$^{-2}$ dose of boron.

9. Diffuse the impurities introduced in step 8.

10. Activation anneal at 350°–450° C. (preferably 400°–420° C.) for up to 2 hours in reducing environment (N₂/H₂) (optional).

11. Deposit backside metal. Typically chromium, nickel, silver or chromium, nickel gold, or titanium, nickel layer.

12. Sinter Anneal (Like Step #9).

Steps 8–12 appear important in achieving reduced on-resistance or forward drops for IGBTs, MOSFETs, diodes, or MCTs. Additionally, cross doping has proven effective in reducing the forward drop of these devices because of the resultant ion implant damage. For example, a phosphorus implant may be used for an IGBT or MCT wafer, even though the backside is a p+substrate. Conversely, a boron implant may be used for an N+substrate.

Thus, as outlined above, the invention achieves superior die passivation using a polymer which is compatible with power device processing for reduced on-state voltage drop. Because of the high temperature characteristics of the polymer, the polymer passivation can be incorporated directly into the regular wafer fab using standard photoresist coating equipment. This eliminates the necessity to perform the step after back-metal deposition or in the "post-tab" assembly process.

While the invention has been particularly shown and described with reference to a specific embodiment thereof, it will be understood by those skilled in the art that the foregoing and other changes in the form and details may be made therein without departing from the spirit or scope of the invention.

What is claimed is:

1. A method for fabricating a semiconductor device, the method comprising the steps of:
   depositing a polymer passivation layer over a semiconductor wafer;
   subsequent to the step of depositing a polymer passivation layer, introducing impurities into a backside of the semiconductor wafer, the backside of the semiconductor wafer being on the opposite side of the semiconductor wafer from the polymer passivation layer; and
   diffusing the impurities into the semiconductor wafer.

2. The method of claim 1 wherein the polymer passivation layer comprises polyimide.

3. The method of claim 1 wherein the step of introducing impurities is accomplished by ion implantation.

4. The method of claim 1 further comprising the step of performing an activation anneal.

5. The method of claim 4 wherein the activation anneal occurs between the temperatures of 350° C. and 450° C.

6. The method of claim 4 wherein the activation anneal occurs between the temperatures of 400° C. and 420° C.

7. The method of claim 1 wherein the impurities are n-type dopants for a semiconductor wafer having an n-type substrate.

8. The method of claim 1 wherein the impurities are p-type dopants for a semiconductor wafer having an n-type substrate.

9. The method of claim 1, further comprising the steps of:
   depositing dielectric material on the semiconductor wafer;
   curing the polymer passivation layer;
   forming apertures in the dielectric material and the polymer passivation layer; and
   depositing a metal layer on the backside of the semiconductor wafer.

10. The method of claim 9 wherein the dielectric material comprises silicon nitride.

11. The method of claim 9 wherein the polymer passivation layer comprises polyimide.

12. The method of claim 9 wherein the step of introducing impurities is accomplished by ion implantation.

13. The method of claim 9 further comprising the step of performing an activation anneal.

14. The method of claim 13 wherein the activation anneal occurs between the temperatures of 350° C. and 450° C.

15. The method of claim 13 wherein the activation anneal occurs between the temperatures of 400° C. and 420° C.

16. The method of claim 9 wherein the impurities are n-type dopants for a semiconductor wafer having an n-type substrate.

17. The method of claim 9 wherein the impurities are p-type dopants for a semiconductor wafer having an n-type substrate.

18. The method of claim 9 wherein the impurities are p-type dopants for a semiconductor wafer having a p-type substrate.

19. The method of claim 9 wherein the impurities are n-type dopants for a semiconductor wafer having a p-type substrate.

20. The method of claim 1 wherein the impurities are p-type dopants for a semiconductor wafer having a p-type substrate.

21. The method of claim 1 wherein the impurities are n-type dopants for a semiconductor wafer having a p-type substrate.

22. A method for fabricating a semiconductor device, the method comprising the steps of:
   depositing dielectric material on a semiconductor wafer;
   depositing a polymer passivation layer over the dielectric material;
   curing the polymer passivation layer;
   forming apertures in the dielectric material and the polymer passivation layer;
   subsequent to the step of depositing a polymer passivation layer, introducing impurities into a backside of the semiconductor wafer, the backside of the semiconductor wafer being on the opposite side of the semiconductor wafer from the polymer passivation layer;
   diffusing the impurities into the semiconductor wafer; and
   depositing a metal layer on the backside of the semiconductor wafer.

23. The method of claim 22 wherein the dielectric material comprises silicon nitride.

24. The method of claim 22 wherein the polymer passivation layer comprises polyimide.

25. The method of claim 22 wherein the step of introducing impurities is accomplished by ion implantation.

26. The method of claim 22 wherein the step of diffusing is accomplished by means of an activation anneal.

27. The method of claim 26 wherein the activation anneal occurs between the temperatures of 350° C. and 450° C.

28. The method of claim 26 wherein the activation anneal occurs between the temperatures of 400° C. and 420° C.

29. The method of claim 22 wherein the impurities are n-type dopants for a semiconductor wafer having an n-type substrate.

30. The method of claim 22 wherein the impurities are p-type dopants for a semiconductor wafer having an n-type substrate.

31. The method of claim 22 wherein the impurities are p-type dopants for a semiconductor wafer having a p-type substrate.

32. The method of claim 22 wherein the impurities are n-type dopants for a semiconductor wafer having a p-type substrate.

33. A method for fabricating a semiconductor device wherein the forward voltage drop of the semiconductor device is reduced, the method comprising the steps of:

depositing silicon nitride on a semiconductor wafer;

depositing dielectric material on the silicon nitride;

depositing a polyimide passivation layer over the dielectric material;

curing the polyimide passivation layer;

depositing a photoresist pattern on the polyimide passivation layer;

etching apertures in the polyimide passivation layer, the dielectric material, and the silicon nitride;

reducing the thickness of the semiconductor wafer with a wafer-thinning operation;

subsequent to the step of depositing a polyimide passivation layer ion implanting impurities into a backside of the semiconductor wafer, the backside of the semiconductor wafer being on the opposite side of the semiconductor wafer from the dielectric material and the polyimide passivation layer;

diffusing the impurities into the semiconductor wafer;

depositing a metal layer on the backside of the semiconductor wafer; and sintering the metal layer and the backside of the semiconductor wafer.

34. The method of claim 33 further comprising the step of performing an activation anneal.

35. The method of claim 34 wherein the activation anneal occurs between the temperatures of 350° C. and 450° C.

36. The method of claim 34 wherein the activation anneal occurs between the temperatures of 400° C. and 420° C.

37. The method of claim 33 wherein the impurities are n-type dopants for a semiconductor wafer having an n-type substrate.

38. The method of claim 33 wherein the impurities are p-type dopants for a semiconductor wafer having an n-type substrate.

39. The method of claim 33 wherein the impurities are p-type dopants for a semiconductor wafer having a p-type substrate.

40. The method of claim 33 wherein the impurities are n-type dopants for a semiconductor wafer having a p-type substrate.

* * * * *